(12) United States Patent
Duncan et al.

(10) Patent No.: US 10,749,477 B2
(45) Date of Patent: Aug. 18, 2020

(54) SERIES VOLTAGE REGULATION MODULATING POWER SUPPLY

(71) Applicant: QUALCOMM Incorporated, San Diego, CA (US)

(72) Inventors: Joseph Duncan, Carlsbad, CA (US); Ngai Yeung Ho, San Diego, CA (US); Kevin Lee Cobley, Royston (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/576,146

(22) Filed: Sep. 19, 2019

(65) Prior Publication Data

US 2020/0099341 A1 Mar. 26, 2020

Related U.S. Application Data

(60) Provisional application No. 62/734,527, filed on Sep. 21, 2018.

(51) Int. Cl.
| | |
|---|---|
| *H04B 1/16* | (2006.01) |
| *H03F 1/02* | (2006.01) |
| *H03F 3/24* | (2006.01) |
| *H04B 1/04* | (2006.01) |

(52) U.S. Cl.
CPC .......... *H03F 1/0233* (2013.01); *H03F 3/245* (2013.01); *H04B 1/0458* (2013.01); *H03F 2200/102* (2013.01); *H03F 2200/294* (2013.01); *H03F 2200/451* (2013.01); *H04B 2001/0433* (2013.01)

(58) Field of Classification Search
CPC .. H03F 1/0233; H03F 3/245; H03F 2200/102; H03F 2200/294; H03F 2200/451; H04B 1/0458; H04B 2001/0433

USPC .................................. 455/127.1, 343.1, 572
See application file for complete search history.

(56) References Cited

U.S. PATENT DOCUMENTS

| | | | |
|---|---|---|---|
| 6,624,712 B1* | 9/2003 | Cygan ................... | H03F 1/0227 332/106 |
| 7,109,897 B1* | 9/2006 | Levesque .............. | H03F 1/0205 330/285 |
| 8,095,090 B2* | 1/2012 | Drogi .................... | H03F 1/0205 455/114.3 |
| 8,659,355 B2 | 2/2014 | Henshaw et al. | |
| 2006/0119425 A1 | 6/2006 | Phillips et al. | |
| 2009/0004981 A1* | 1/2009 | Eliezer .................. | H03F 1/0211 455/127.1 |

(Continued)

FOREIGN PATENT DOCUMENTS

WO    2004075398 A1    9/2004

*Primary Examiner* — Sonny Trinh
(74) *Attorney, Agent, or Firm* — Patterson & Sheridan, LLP (57) ABSTRACT

Certain aspects of the present disclosure provide methods and apparatus for series voltage regulation in an envelope tracking modulated supply. One example of an envelope tracking modulated supply includes a switched-mode power supply (SMPS), a voltage regulator, and a power amplifier having a supply input coupled to an output of the first voltage regulator. In certain aspects, the first voltage regulator is coupled in series between the power amplifier and two or more outputs the SMPS and is configured to generate a voltage at the output of the first voltage regulator based on an envelope of a signal to be amplified by the first power amplifier.

18 Claims, 10 Drawing Sheets (56) References Cited

U.S. PATENT DOCUMENTS

| | | | |
|---|---|---|---|
| 2009/0303754 A1* | 12/2009 | Choi | H02M 3/28 363/20 |
| 2010/0311365 A1* | 12/2010 | Vinayak | H03F 3/24 455/127.1 |
| 2015/0188432 A1* | 7/2015 | Vannorsdel | H02M 3/156 323/271 |
| 2015/0326186 A1* | 11/2015 | Hong | H03F 1/0227 330/291 |
| 2018/0034417 A1* | 2/2018 | Duncan | G05F 1/461 |
| 2018/0069476 A1* | 3/2018 | Koli | H02M 1/38 |

* cited by examiner

SERIES VOLTAGE REGULATION MODULATING POWER SUPPLY

CROSS-REFERENCE TO RELATED APPLICATION

This application claims benefit of and priority to U.S. Provisional Patent Application Ser. No. 62/734,527, filed Sep. 21, 2018, herein incorporated by reference in its entirety as if fully set forth below and for all applicable purposes.

TECHNICAL FIELD

Certain aspects of the present disclosure generally relate to envelope tracking and, more particularly, to series voltage regulation in an envelope tracking modulated power supply.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), EDGE (Enhanced Data rates for Global Evolution), or 5G-New Radio (NR). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

Amplifiers (e.g., power amplifiers, etc.) may be used in a variety of systems to increase the power of an input signal, such as in wireless communication systems utilizing radio frequency (RF) signals. For example, amplifiers may be used in wireless communication systems to increase the power of an RF signal for transmission, or increase the power of a received RF signal. RF front ends in such systems may implement envelope tracking, in which the power supply voltage to the amplifier is adjusted to roughly track the envelope of a signal for transmission.

SUMMARY

Certain aspects of the present disclosure relate to series voltage regulation in an envelope tracking modulated supply. Advantageously, multiple voltage regulators may be coupled in series to the same switched-mode power supply. Each of the voltage regulators may supply a power input to a separate power amplifier (PA).

Certain aspects of the present disclosure provide an envelope tracking modulated supply. The envelope tracking modulated supply generally includes a switched-mode power supply (SMPS), a first voltage regulator, and a first power amplifier having a supply input coupled to an output of the first voltage regulator, wherein the first voltage regulator is coupled in series between the power amplifier and two or more outputs the SMPS, the first voltage regulator being configured to generate a voltage at the output of the first voltage regulator based on an envelope of a signal to be amplified by the first power amplifier.

Certain aspects of the present disclosure provide a method of generating a plurality of modulated supply voltages. The method generally includes generating, by a SMPS, multiple output voltages at a plurality of outputs of the SMPS, determining, by a transmitter, an envelope of a first radio frequency (RF) input signal to be amplified and, selecting, by a first voltage regulator coupled to at least two of the plurality of outputs of the SMPS, a first one of the multiple output voltages based, at least in part, on the envelope of the first RF input signal.

Certain aspects of the present disclosure provide an envelope tracking modulated supply. The envelope tracking modulated supply generally includes a voltage regulator having a first input coupled to multiple voltage rails, and a power amplifier having a supply input coupled to an output of the voltage regulator. The voltage regulator may be configured to select one or more of the multiple voltage rails, based on an envelope of a signal to be amplified by the power amplifier, to provide power to the power amplifier.

Certain aspects of the present disclosure provide a method of generating a plurality of modulated supply voltages. The method generally includes determining, by a transmitter, an envelope of a RF input signal to be amplified by a power amplifier, and selecting, by a voltage regulator coupled to multiple voltage rails, one or more of the multiple voltage rails to provide power to the power amplifier based, at least in part, on the envelope of the RF input signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure generally relate to series voltage regulation for an envelope tracking modulated supply. The modulated supply includes a switched-mode power supply (SMPS), one or more voltage regulators, and one or more power amplifiers (PAs). The one or more voltage regulators may be coupled in series to the SMPS. Each voltage regulator provides a power input to a respective PA, as described in more detail herein.

The SMPS generates multiple output voltages. In certain aspects, each of the series regulators selects one or more of the output voltages generated by the SMPS based on the envelope of the RF signal to be amplified by a respective PA. For example, each of the voltage regulators may be configured to dynamically select the lowest voltage output from the SMPS that is greater than a voltage to be supplied from the voltage regulator to the respective PA. The voltage to be supplied from the first voltage regulator is based on the envelope of the RF input signal to be amplified by the PA.

Certain aspects of the present disclosure provide an SMPS, a transmitter, and a voltage regulator. The voltage regulator may select one or more of multiple voltage outputs of an SMPS based on the envelope of the RF input signal to be amplified by a power amplifier. At certain times, the voltage regulator may dynamically select one of the multiple voltage outputs of the SMPS. At other times, the voltage regulator may select more than one of the multiple voltage outputs of the SMPS to provide power to a power amplifier.

In an example, the voltage regulator may select a single output of the multiple output voltages to provide power to the PA during a first period based on the envelope of the RF input signal. In a second period, different than the first period, the voltage regulator may select two or more outputs of the SMPS. The one or multiple outputs may be selected by the voltage regulator based on the envelope of the RF input signal, as described herein. As the envelope of the RF input signal changes with time, the voltage regulator dynamically switches between selecting a single output and selecting two or more outputs.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), Time Division Synchronous Code Division Multiple Access (TD-SCDMA), 5G-NR and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards.

An Example Wireless System

Figure 1:
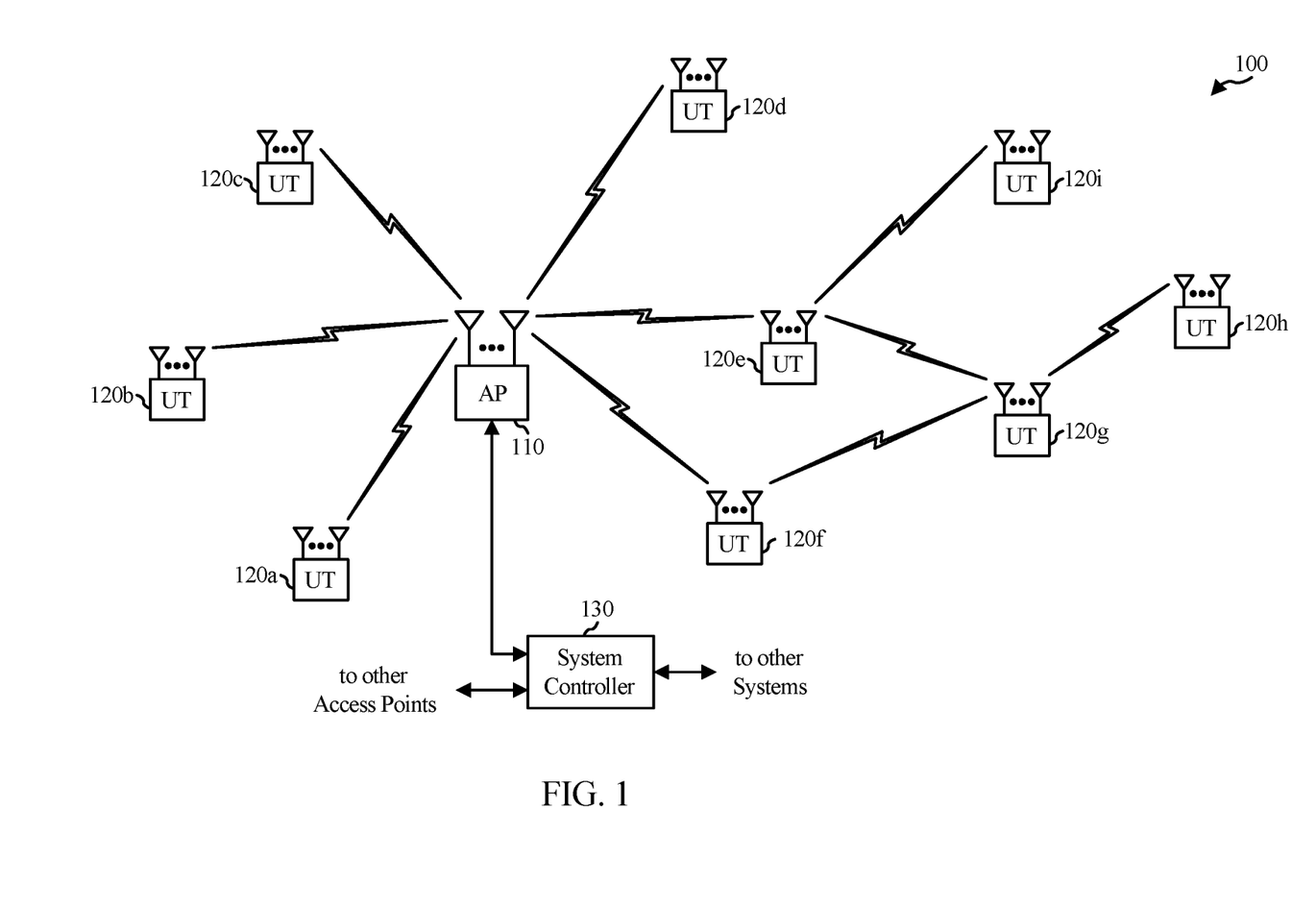
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In one example, the access point 110 or the user terminal 120 may include a transmitter, an SMPS, a voltage regulator and a PA. According to aspects, the voltage regulator is capable of selecting two or more outputs of the SMPS, based on the envelope of an RF signal to be amplified, to supply power to a PA.

In another example, the access point 110 or the user terminal 120 may include a transmitter, an SMPS, a plurality of voltage regulators, and a plurality of PAs. Each of the voltage regulators is connected in series to the SMPS. Each of the plurality of voltage regulators provides one or more voltage outputs to a respective PA based, at least in part, on the envelope of an RF signal to be amplified.

A first output of the transmitter carries an envelope of the signal to be amplified to a first voltage regulator. A second output of the transmitter carries a signal to be amplified by the first PA. The first voltage regulator provides a power input to the first PA based, at least in part, on the envelope of the signal to be amplified. Advantageously, the first voltage regulator dynamically selects a lowest voltage output of the multiple voltage outputs generated by the SMPS as the power input to the first PA. The access point 110 or the user terminal 120 may include multiple voltage regulators, wherein each voltage regulator is configured to provide a power input (also referred to as a "supply input") to a respective PA based on an envelope of the RF signal to be amplified by the PA. According to aspects, one or more of the voltage regulators may be configured to select, at any given time, one or multiple outputs of the SMPS based on an envelope of an RF input signal to be amplified.

Figure 2:
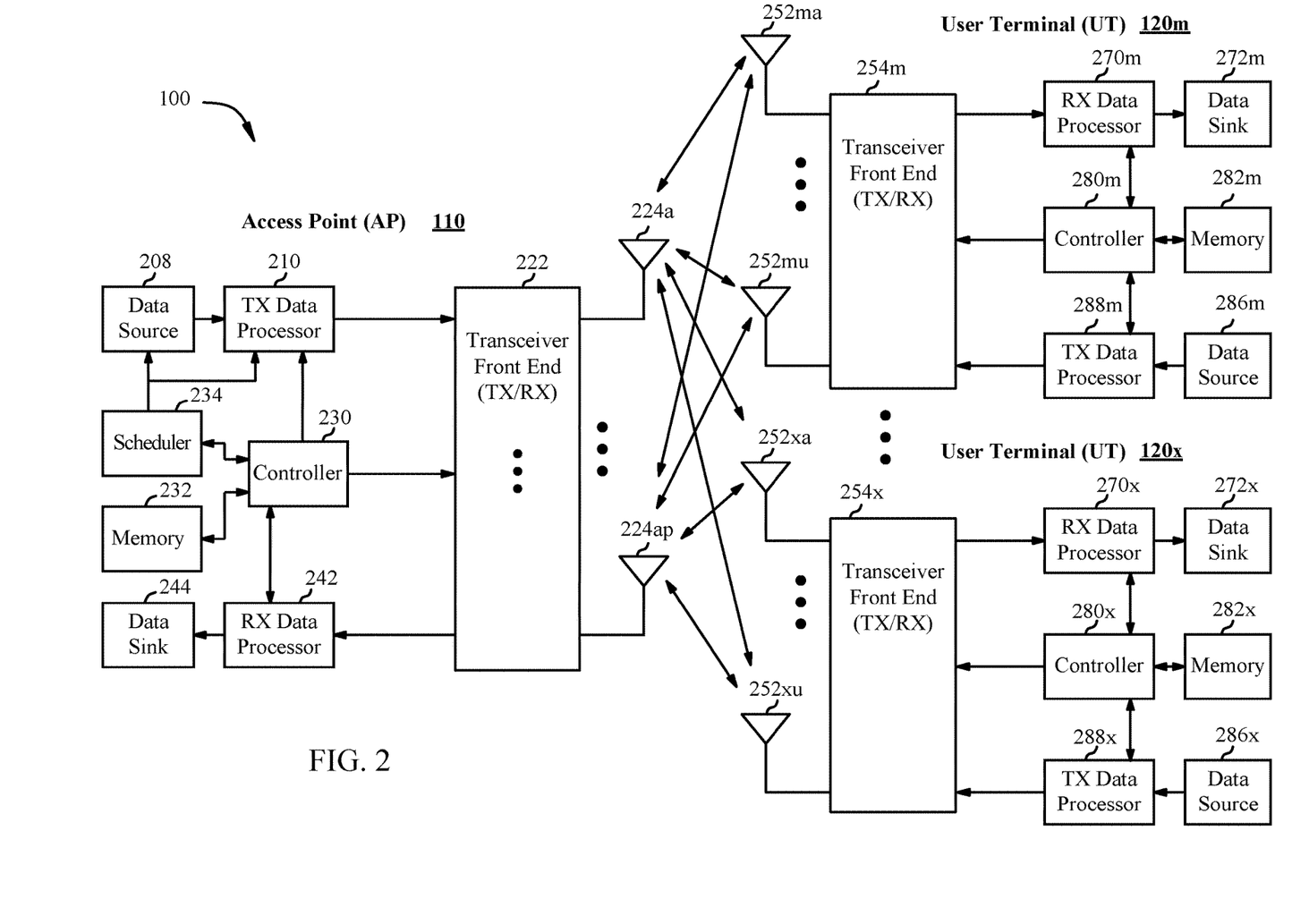
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. For certain aspects, the access point 110 is instead implemented as a base station, and/or one or more of the user terminals 120 are instead implemented as one or more mobile stations. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals may be selected for simultaneous transmission on the uplink, $N_{dn}$ user terminals may be selected for simultaneous transmission on the downlink, $N_{up}$ may or may not be equal to Nan, and $N_{up}$ and $N_{dn}$ may be static values or can change for each scheduling interval. Beam-steering or some other spatial processing technique may be used at the access point, base station, mobile station, and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver/front end (TX/RX) 254 (also known as a radio frequency front end (RFFE)) receives and processes (e.g., converts to analog, amplifies, filters, and frequency upconverts) a respective symbol stream to generate an uplink signal. The transceiver/front end 254 may also route the uplink signal to one of the $N_{ut,m}$ antennas for transmit diversity via an RF switch, for example. The controller 280 may control the routing within the transceiver/front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver/front end 222 may select signals received from one of the antennas 224 for processing. The signals received from multiple antennas 224 may be combined for enhanced receive diversity. The access point's transceiver/front end 222 also performs processing complementary to that performed by the user terminal's transceiver/front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

While FIG. 2 illustrates the transceiver/front ends 222, 254 each in a single box, those of skill in the art will appreciate that elements of the transceiver/front ends 222, 254 may be implemented across various elements, chips, modules, etc. For example, down and/or upconversion elements may be included in a transceiver chip within the transceiver/front end 222, 254, while a power amplifier and/or envelope tracking elements may be implemented in a module separate from the transceiver chip within the transceiver/front end 222, 254.

The transceiver/front end (TX/RX) 222 of access point 110 and/or the TX/RX 254 of user terminal 120 may include an SMPS, a voltage regulator, and a PA, in accordance with certain aspects of the present disclosure. In accordance with certain aspects, the TX/RX 222 of access point 110 and/or the TX/RX 254 of user terminal 120 may include an SMPS, plurality of voltage regulators, and a plurality of PAs. In either case, each of the PAs may amplify an RF input signal having a different envelope.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one or more of the $N_{dn}$ user terminals to be transmitted from one of the $N_{ap}$ antennas. The transceiver/front end 222 receives and processes (e.g., converts to analog, amplifies, filters, and frequency upconverts) the symbol stream to generate a downlink signal. The transceiver/front end 222 may also route the downlink signal to one or more of the $N_{ap}$ antennas 224 for transmit diversity via an RF switch, for example. The controller 230 may control the routing within the transceiver/front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver/front end 254 may select signals received from one of the antennas 252 for processing. The signals received from multiple antennas 252 may be combined for enhanced receive diversity. The user terminal's transceiver/front end 254 also performs processing complementary to that performed by the access point's transceiver/front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof, among other systems/schemes.

Figure 3:
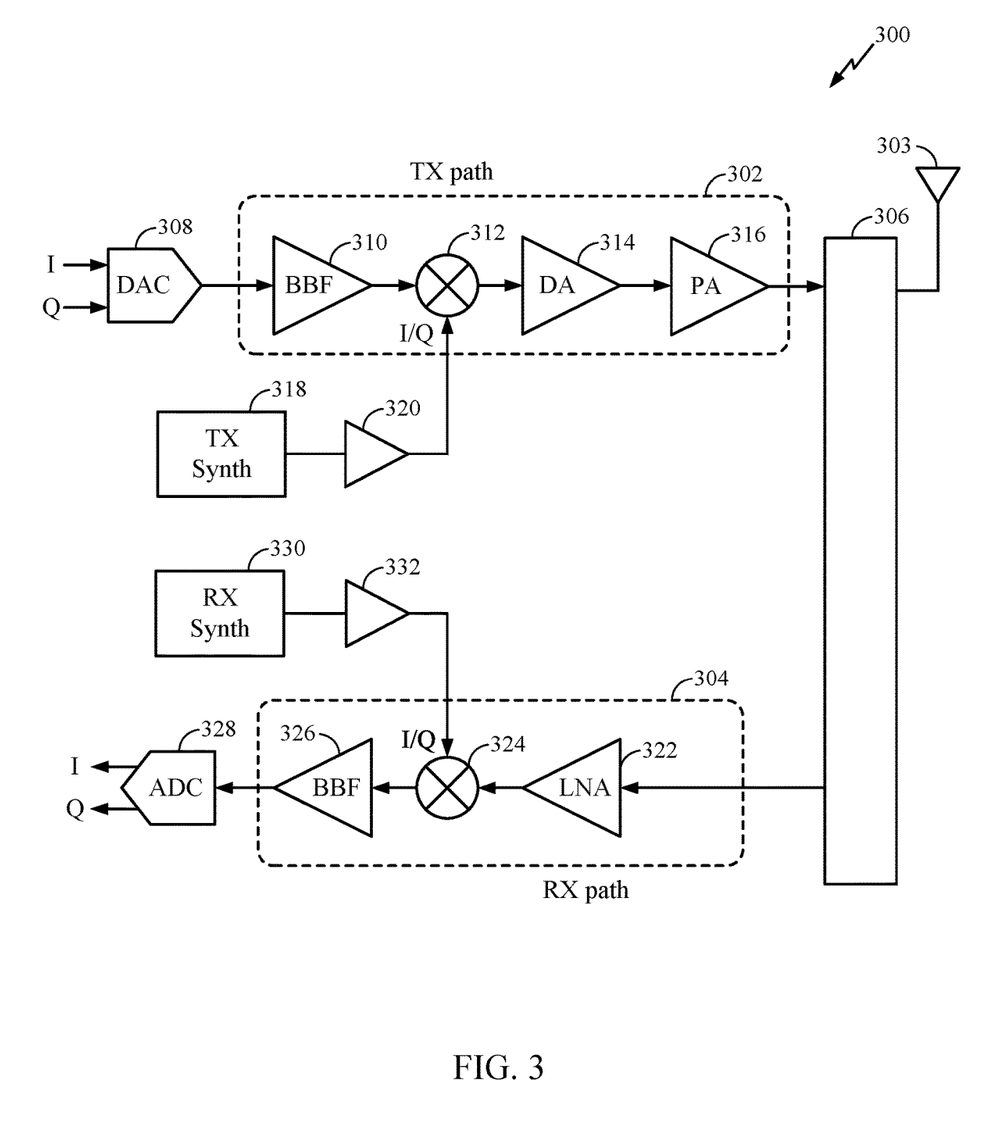
FIG. 3 is a block diagram of an example transceiver/front end, in accordance with certain aspects of the present disclosure.

FIG. 3 is a block diagram of an example transceiver/front end 300, such as transceiver/front ends 222, 254 in FIG. 2, in which aspects of the present disclosure may be practiced. The transceiver/front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) and/or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 318, whose output may be buffered or amplified by amplifier 320 before being mixed with the baseband signals in the mixer 312. Similarly, the receive LO may be produced by an RX frequency synthesizer 330, whose output may be buffered or amplified by amplifier 332 before being mixed with the RF signals in the mixer 324. The transceiver/front end 300 may, for example, be configured for operation in quadrature or polar.

In some aspects, the power supply for the PA 316 may comprise an envelope tracking power supply, in accordance with certain aspects of the present disclosure. The envelope tracking power supply may be configured to adjust the power supplied to the PA 316, where the voltage of the modulated power supply for the PA 316 substantially tracks (or is otherwise based on) the envelope (e.g., envelope waveform) of the signal to be amplified by the PA 316, for example, as described in more detail below.

Figure 4:
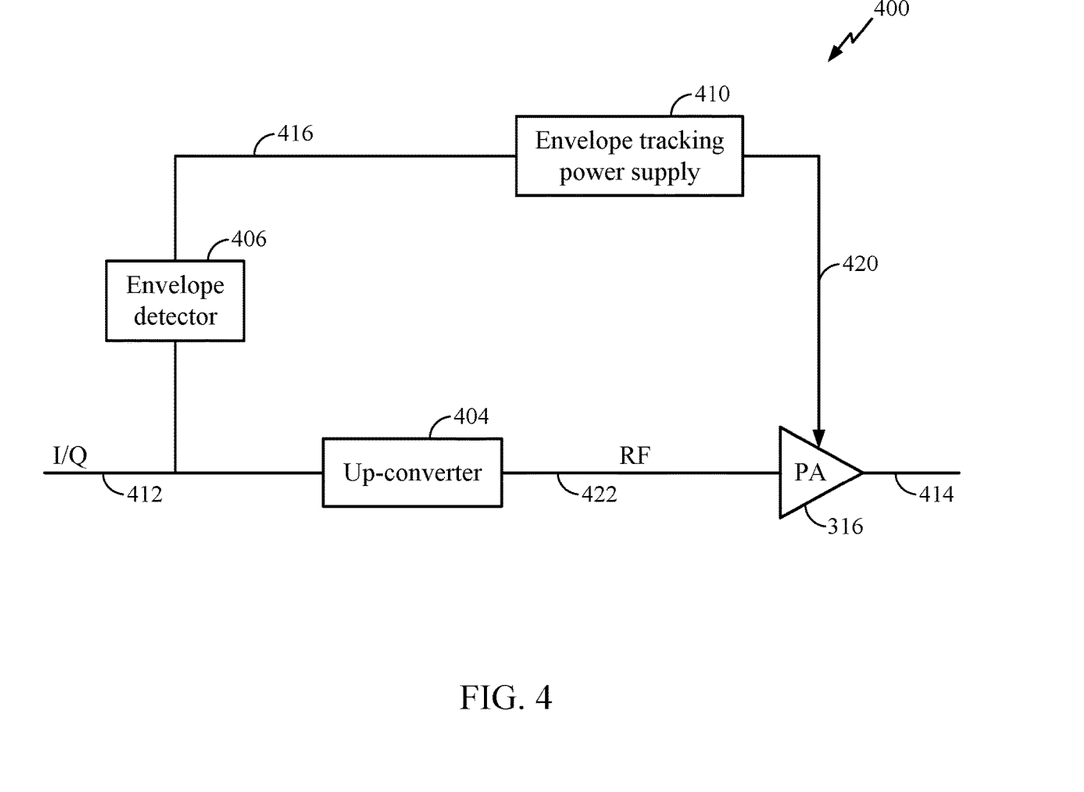
FIG. 4 is a block diagram of an example envelope tracking amplification system, in accordance with certain aspects of the present disclosure.

FIG. 4 illustrates an example envelope tracking amplification system 400, in which aspects of the present disclosure may be practiced. The envelope tracking amplification system 400 may include a PA 316, an up-converter 404, an envelope detector 406, and an envelope tracking power supply 410. As illustrated, the PA 316 may be configured to amplify an any input voltage signal Vn 412 (or a signal based on the input signal). In an example, the input voltage signal 412 may represent an in-phase (I) and/or quadrature (Q) signal, such as the output of the DAC 308 or of the BBF 310, digital pre-distortion (DPD) signal, or polar coordinates. In some cases, the input voltage signal 412 may be upconverted to an RF input signal 422 by the up-converter 404 before being amplified by the PA 316. The up-converter 404 may include the mixer 312 in FIG. 3, for example.

The input voltage signal 412 may also be used as an input to the envelope detector 406, which generates an envelope signal representing the envelope of the input voltage signal 412 at an output 416 thereof (e.g., provides a signal representing the magnitude of the input voltage signal 412). The output 416 of the envelope detector 406 provides an input to the envelope tracking power supply 410, which provides a supply voltage 420 to the PA 316 based on the output 416. In this manner, the supply voltage 420 of the PA is adjusted based on (e.g., substantially tracks) the envelope of the input voltage signal 412. The PA 316 amplifies the input voltage signal 412 or the RF input signal 422 to generate an amplified output signal 414 for transmission by an antenna, for example. The PA 316 may be implemented as a single stage or multi-stage amplifier. In some cases, one or more other processing stages (e.g., implementing a shaping function such as a detroughing function) may be implemented in the envelope path.

Example Series Voltage Regulation

Envelope tracking architectures, such as the envelope tracking (ET) amplification system 400 in FIG. 4, provide thermal and power consumption savings as compared to directly connecting the transmitting power amplifier (PA) to a battery or another quasi-direct-current (DC) rail (as done in average power tracking (APT)). Envelope tracking architectures also enable a higher transmit power as compared to battery-connected or APT architectures.

For certain wireless technologies, such as 5G, wider bandwidths make conventional ET architectures difficult to implement. For example in an effort to support wider bandwidths and due to band proliferation, a user terminal may need to support an increased number of PAs. Additionally, to support wide bandwidths, an envelope tracker should be located close to each of the PAs. As the number of transmitting PAs increases, the cost and area associated with the PAs becomes prohibitive.

ET architectures typically include a variant of a highly efficient switched-mode power supply (SMPS) connected in parallel to a linear regulator. In this case, the SMPS is configured to deliver an average or low-frequency component of the output power, and the linear regulator is configured to control an envelope of the signal to be amplified at the output of the linear regulator and provide a low shunt impedance to reduce noise from the SMPS. Because the SMPS and the linear regulator are coupled in parallel, the SMPS may not be shared by multiple PAs.

Figure 5:
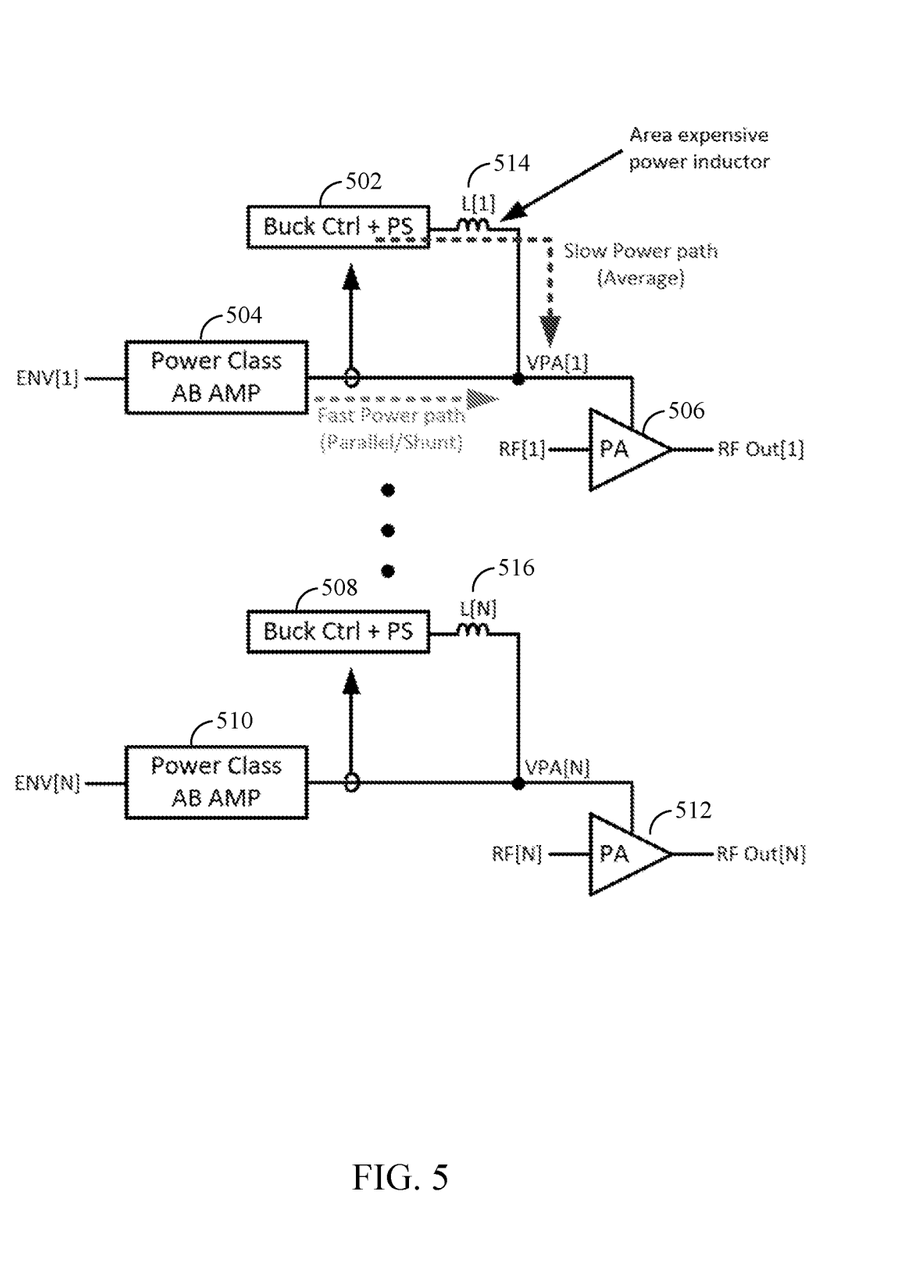
FIG. 5 is a block diagram of an example of an envelope tracking architecture.

FIG. 5 illustrates an example ET architecture 500. According to an example, a first PA 506 is coupled to a first SMPS 502 and a first linear regulator 504, and a second PA 512 is coupled to a second SMPS 508 and a second linear regulator 510. The parallel connection of an SMPS and a linear regulator to each PA leads to high implementation costs and area per transmitting PA.

Current ET architectures also include a power inductor for each PA. As an example, a power inductor 514 is coupled to an output of the first SMPS 502 and to a power supply (PS) input of the first PA 506. Similarly, a power inductor 516 is coupled to an output of the second SMPS 508 and to a power supply input of the second PA 512. Each of the power inductors is area expensive. The first SMPS 502 and the second SMPS 508 may be implemented as switch-mode buck regulators.

Figure 6:
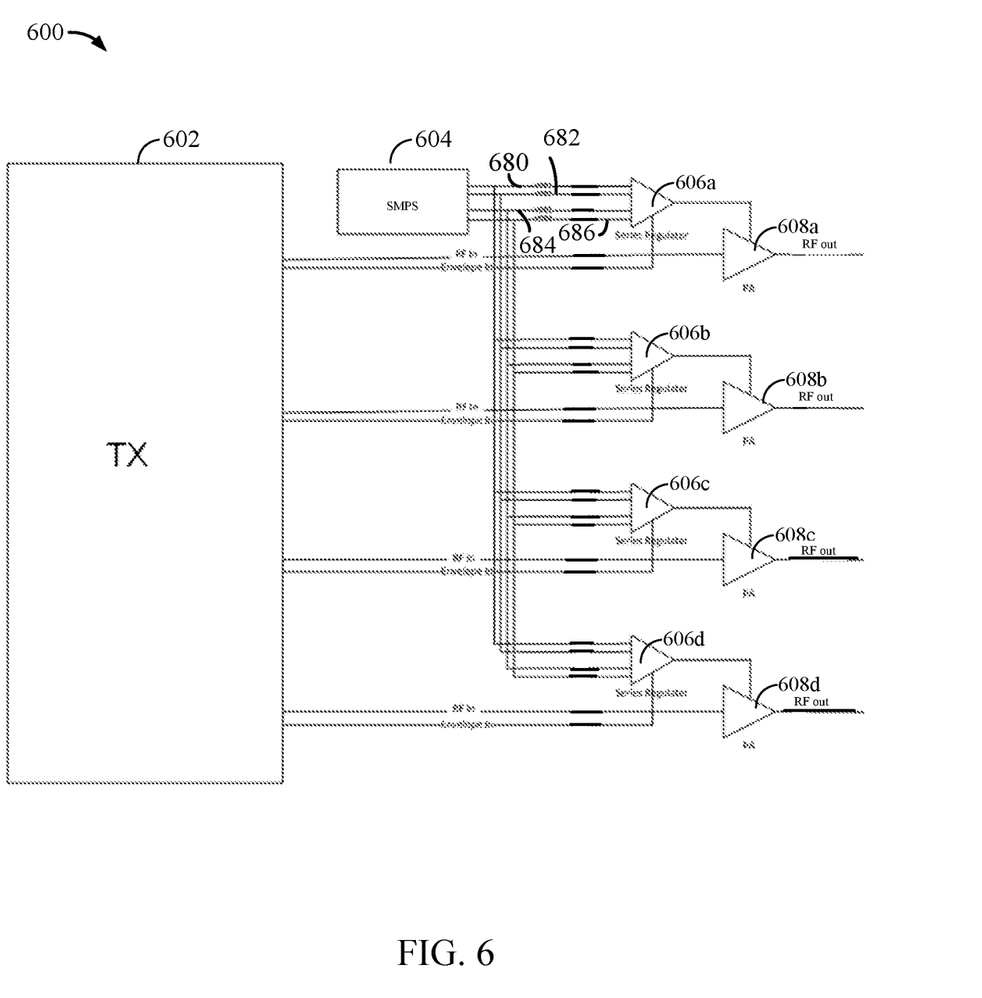
FIG. 6 is a block diagram of an example of an envelope tracking modulated supply including series voltage regulation, in accordance with aspects of the present disclosure.

FIG. 6 illustrates an example of series voltage regulation in an envelope tracking modulated power supply 600, in accordance with aspects of the present disclosure. In an effort to support envelope tracking for wireless technologies supporting wide bandwidths while reducing a component count and solution area per simultaneous transmitting chain, an envelope tracking modulated power supply is provided that includes one SMPS, series-connected linear regulators, and multiple PAs.

Specifically, the envelope tracking modulated power supply 600 comprises a transmitter 602, an SMPS 604, a plurality of voltage regulators 606a-606d, and a plurality of PAs 608a-608d. While FIG. 6 illustrates an envelope tracking modulated power supply having a plurality of voltage regulators and a plurality of PAs to facilitate understanding, the envelope tracking modulated power supply may be implemented with a single voltage regulator and a single PA. A first output of the transmitter 602 is coupled to a first node configured to carry an envelope of a first signal to be amplified, by a first PA 608a, to a control input of a first linear regulator (e.g., voltage regulator 606a). A second output of the transmitter 602 is coupled to a second node configured to carry an envelope of a second signal to be amplified, by a second PA 608b, to a control input of a second linear regulator 606b. According to an example, as illustrated in FIG. 6, a third output of the transmitter 602 is coupled to a third node configured to carry an envelope of a third signal to be amplified, by a third PA 608c, to a control input of a third linear regulator 606c and a fourth output of the transmitter 602 is coupled to a fourth node configured to carry an envelope of a fourth signal to be amplified, by a fourth PA 608d, to a control input of a fourth linear regulator 606d. The transmitter is configured to upconvert first-fourth baseband signals to first-fourth RF signals for outputting at the first-fourth outputs of the transmitter, respectively.

Additionally, outputs of the transmitter 602 are coupled to a signal input (RF In) of each of the PAs 608a-608d. The signal inputs carry the signal to be amplified by a respective PA.

The SMPS 604 generates multiple voltage outputs VDD1-VDD4 at output nodes 680, 682, 684, 686. The multiple voltage outputs are coupled to multiple inputs of each of the voltage regulators 606a-606d. Each voltage regulator 606a-606d provides a voltage to a respective PA 608a-608d. For example, each PA 608a-608d may be closely coupled to a respective voltage regulator 606a-606d.

While four voltage outputs VDD1-VDD4, four linear regulators 606a-606b, and four PAs 608a-608d are illustrated in FIG. 6 to facilitate understanding, the envelope tracking modulated supply may include any number of voltage outputs from the SMPS coupled to any number of linear regulators, and PAs. The number of voltage outputs from the SMPS, linear regulators, and PAs may be equal, as illustrated in FIG. 6, or may be different.

The SMPS 604 concurrently generates the multiple voltage outputs. The voltage outputs may be static rails. The SMPS may include multiple physical SMPSs (for example, multiple chips, multiple blocks) or may be a single component. Each of the voltage regulators 606a-606d is configured to selectively couple one of the multiple voltage outputs of the SMPS 604 to a power input of a respective PA based on the envelope of the signal to be amplified by the PA. As an example, the voltage regulator 606a continuously selects one or more of the voltage outputs VDD1-VDD4 and couples the selected voltage output to the power input of the first PA 608a. More specifically, the voltage regulator 606a selects the voltage output VDD1-VDD4 to regulate for the power input of the first PA 608a based on the instantaneous envelope of a signal to be amplified by the first PA 608a.

Advantageously, as illustrated in FIG. 6 a SMPS 604 is in series with a plurality of voltage regulators 606a-606d (e.g., linear regulators), which allows sharing of the SMPS 604 between multiple PAs 608a-608d. Additionally, in contrast to the architecture illustrated in FIG. 5, the envelope tracking modulated supply architecture illustrated in FIG. 6 does not require a power inductor for each of the PAs 608a-608d. Instead, the SMPS 604 may include a single power inductor and one or more decoupling capacitive elements. The reduction in component parts reduces the bill of materials required per transmitting PA and saves space.

Voltage regulation in series may be used, for example, in sub-regulation low dropout (LDO) voltage regulators. Each voltage regulator draws input current to supply the output from multiple rails (e.g., supply voltage outputs) of an SMPS output by selecting and using the lowest compatible voltage that minimizes linear (V*I) losses in the voltage regulator. This is more efficient than single-supply-rail linear regulation, without the high overhead associated with one SMPS per transmitting PA.

Figure 7:
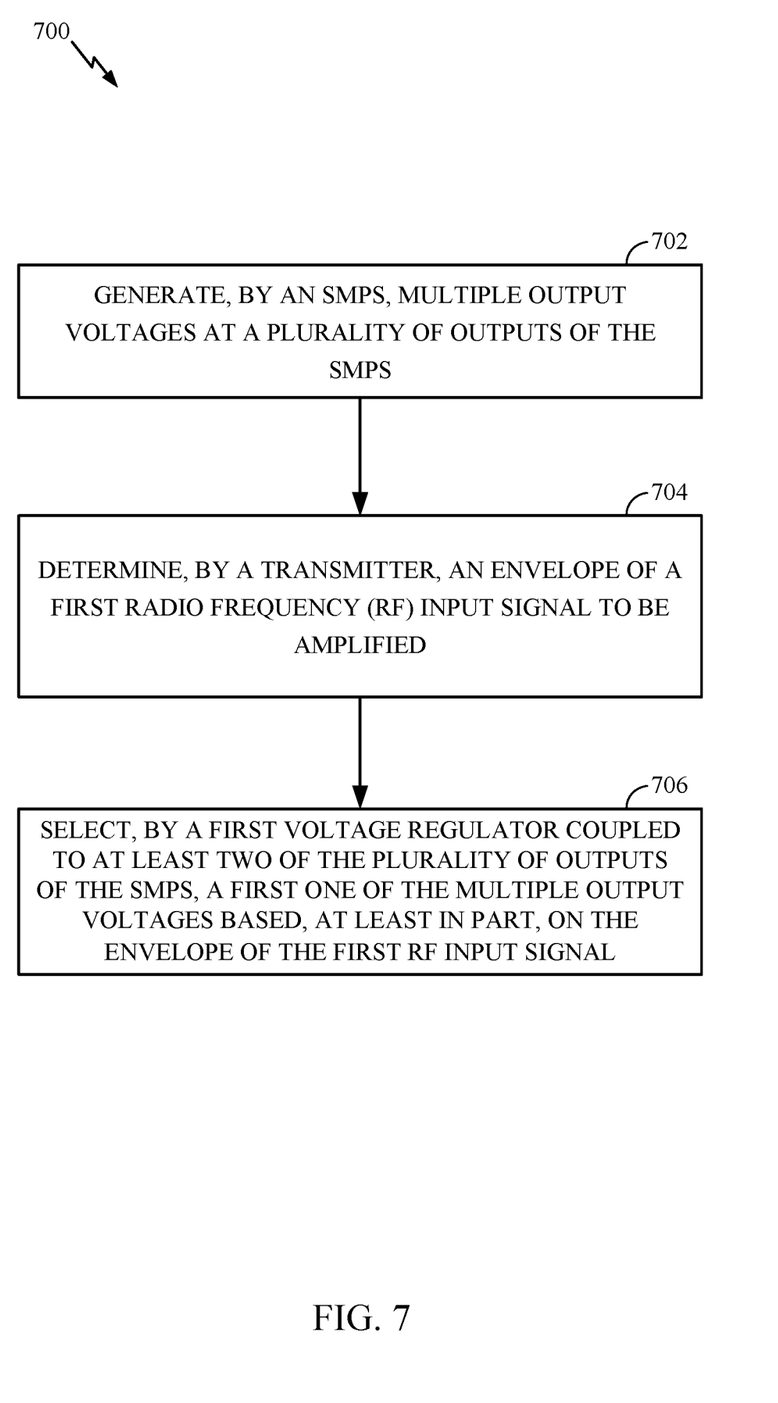
FIG. 7 is a flow diagram of example operations to generate a plurality of modulated supply voltages, in accordance with certain aspects of the present disclosure.

FIG. 7 is a flow diagram of example operations 700 for series voltage regulation, in accordance with certain aspects of the present disclosure. The operations 700 may be performed by an envelope tracking modulated power supply, such as the envelope tracking modulated power supply 600 of FIG. 6.

The operations 700 may begin, at block 702, with the SMPS generating multiple output voltages. The SMPS concurrently generates the multiple voltage outputs at a plurality of outputs of the SMPS. At block 704, the transmitter may determine an envelope of a first RF input signal to be amplified. At block 706, a first voltage regulator may select a first one of the multiple output voltages based, at least in part, on the envelope of the first RF input signal. In certain aspects, the envelope tracking modulated power supply may also determine, by the transmitter, an envelope of a second RF input signal to be amplified. In this case, a second voltage regulator may select a second one of the multiple output voltages based, at least in part, on the envelope of the second RF input signal. The first one and the second one of the multiple output voltages may be the same or different.

As will be described in more detail with respect to FIG. 8, the first voltage regulator selects the first one of the multiple output voltages by dynamically selecting a lowest voltage output of the multiple output voltages that is greater than a voltage to be supplied from the first voltage regulator to a first power amplifier. The voltage to be supplied from the first voltage regulator is based on the instantaneous envelope of the first RF input signal to be amplified by a first power amplifier. In certain aspects, other factors may influence the voltage to be supplied to the first voltage regulator (or other voltage regulators described herein). These factors may include the gain of the power amplifier, the headroom for the power amplifier, and the headroom for the linear regulator, when the envelope signal is input-referenced (e.g., the envelope signal is generated based on the RF input signal to be amplified by the power amplifier). The headroom for the power amplifier generally describes an offset voltage on top of an output-referenced instantaneous envelope (e.g., the instantaneous envelope of the power amplifier output). For example, the headroom of the power amplifier may be the offset voltage (e.g., voltage difference) between the supply voltage and the output voltage of the power amplifier required to maintain an operating point of the power amplifier, such as the 1 dB compression point. The headroom of the linear regulator may be the voltage needed by the linear regulator to maintain some desired level of regulation. In some aspects, an output-referenced envelope signal may be used. In other words, the envelope of the signal to be amplified may be determined using the output signal of the power amplifier.

Additionally, the second voltage regulator selects the second one of the multiple output voltages by dynamically selecting a lowest voltage output of the multiple voltage outputs that is greater than a voltage to be supplied from the second voltage regulator to a second power amplifier. The voltage to be supplied from the second voltage regulator is based on the instantaneous envelope of the second RF input signal to be amplified by the second power amplifier.

In certain aspects, the voltage regulator is capable of selecting one or more outputs of the SMPS, based on an envelope of the RF input signal to be amplified, to provide power to the PA. As will be described in more detail with reference to FIG. 8, at certain times, based on the envelope of the RF input signal to be amplified, the voltage regulator selects a single output of the SMPS to provide power to the PA. At other times, the voltage regulator selects multiple outputs of the SMPS to concurrently provide power to the PA.

Figure 9:
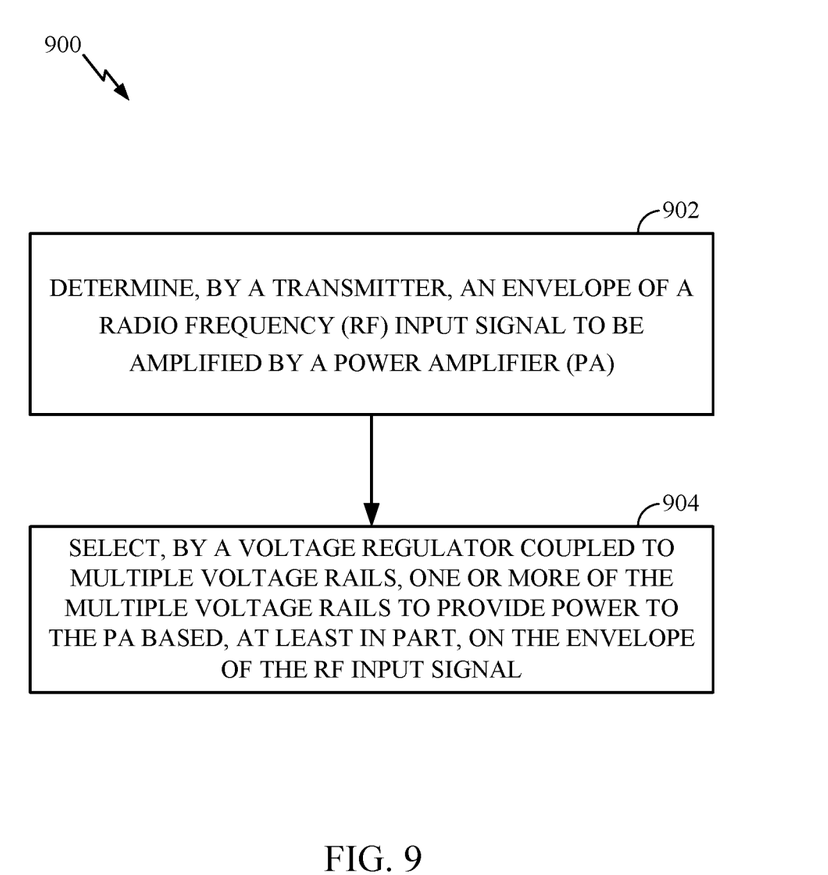
FIG. 9 is a flow diagram of example operations to generate multiple voltage outputs and select one or more of the voltage outputs, according to aspects of the present disclosure.

FIG. 9 is a flow diagram of example operations 900 for voltage regulation, in accordance with certain aspects of the present disclosure. The operations 900 may be performed by an envelope tracking modulated power supply, such as the envelope tracking modulated power supply 600 of FIG. 6.

The operations 900 may begin, at block 902, with transmitter determining an envelope of an RF input signal to be amplified by a PA. At block 904, the voltage regulator coupled to multiple voltage rails may select one or more of the multiple voltage rails to provide power to the PA based, at least in part, on the envelope of the RF input signal.

Figure 8:
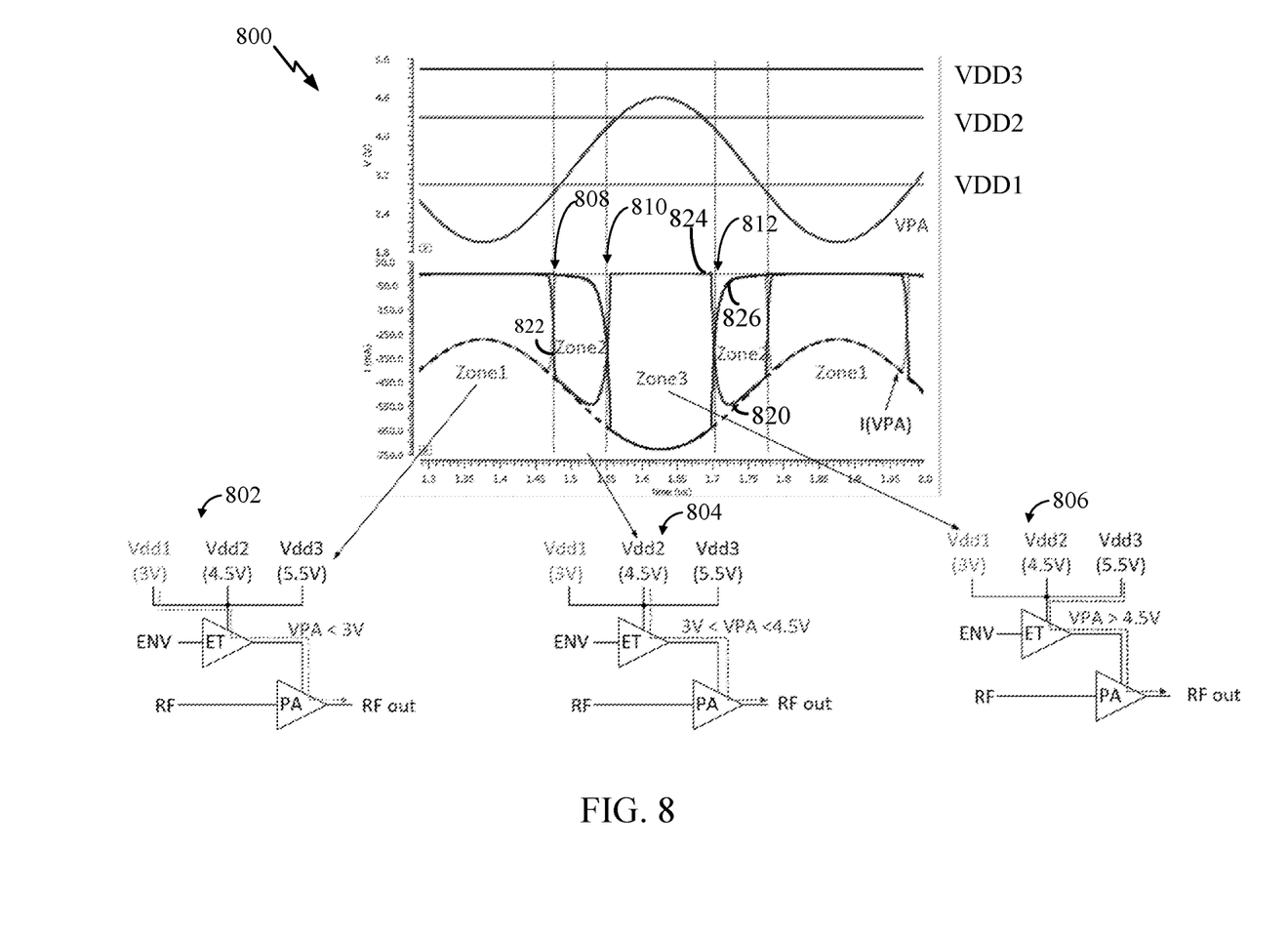
FIG. 8 is a schematic diagram illustrating an example of generating a modulated supply voltage for a single power amplifier (PA), in accordance with certain aspects of the present disclosure.

FIG. 8 illustrates an example of generating a modulated supply voltage for a single PA, in accordance with aspects of the present disclosure. FIG. 8 illustrates one example method where power may be combined from multiple rails; however, the example illustrated in FIG. 8 is not the only method for generating a modulated supply voltage for a single PA. The upper portion of the graph 800 illustrates a simplified PA supply and three static input rails. The three input rails may be generated by an SMPS and may correspond to VDD1-VDD3 in FIG. 6. The bottom portion of the graph illustrates the PA supply current (e.g., I(VPA) 820) and the current drawn from each of the three static input rails VDD1-VDD3 (e.g., I(VDD1) 822, I(VDD2) 824, I(VDD3) 826). The load current commutates between the input supplies as the output voltage crosses the input supplies.

The voltage regulator supplying a voltage to the PA dynamically selects the lowest voltage output of the three rails VDD1-VDD3 that is greater than the voltage to be supplied from the voltage regulator to the PA based on the envelope of the signal to be amplified by the PA. In FIG. 8, VPA represents the envelope of the signal to be amplified by a particular PA. In Zone 1, the VPA is below VDD1. Accordingly, as shown in diagram 802, the voltage regulator selects VDD1 (3V) as the voltage based on which a regulated voltage at the supply input of the PA is generated. In Zone 2, the VPA is between 3V and 4.5V. Accordingly, as shown in diagram 804, the voltage regulator selects VDD2 (4.5V) as the voltage to be used for the voltage regulation. In Zone 3, the VPA is greater than 4.5V. Accordingly, as shown in diagram 806, the voltage regulator selects VDD3 (5.5V) as the voltage to be used for voltage regulation. Dynamically selecting the lowest power supply based on the VPA level reduces power consumption by allocating the majority of the power conversion to the SMPS. In other words, each of the voltage regulators described herein selects one or more of the voltage rails of the SMPS, based on which the voltage regulator will operate (e.g., generate a regulated output at the supply input of the power amplifier). Reducing the voltage on which the voltage regulator operates reduces the power dissipated by the linear regulator when outputting the envelope signal (e.g., regulated output) provided as the PA supply input. The level of regulation may depend on the available headroom of the voltage regulator (e.g., the voltage difference between the selected voltage rail and the regulated output voltage).

In certain aspects, one or more of the voltage regulators is configured to dynamically select one or multiple input rails to provide power to the PA. Because the envelope of the RF input signal varies in time, the voltage regulator is capable of selecting either one rail or more than one rail to simultaneously provide power to the PA.

For example, when the envelope of the signal to be amplified by a particular PA transitions from Zone 1 to Zone 2 at time 808, a voltage regulator is capable of selecting both VDD1 (3 V) and VDD2 (4.5 V). Similarly, when the envelope of the signal to be amplified by a particular PA transitions from Zone 2 to Zone 3 at time 810, the voltage regulator is capable of selecting VDD2 (4.5 V) and VDD3 (5.5 V). When the envelope of the signal to be amplified by a particular PA transitions from Zone 3 to Zone 2 at time 812, the voltage regulator is capable of selecting VDD3 (5.5 V) and VDD2 (4.5 V). Therefore, multiple rails may provide power to the PA based on the envelope of the RF input signal.

Certain aspects of the present disclosure provide an envelope tracking modulated supply. The envelope tracking modulated supply includes an SMPS, a plurality of voltage regulators, and a plurality of PAs. Each of the voltage regulators is coupled in series to the SMPS. The voltage regulators dynamically select the voltage output from the SMPS that is greater than or equal to the voltage to be supplied to a respective PA. The envelope tracking modulated supply reduces component count, by having a common SMPS for all of the linear regulators and eliminating the need for a separate power inductor for each of the PAs. The architecture more easily allows the linear regulator to be located close to the PA to enable high bandwidth envelope tracking capabilities.

Figure 10:
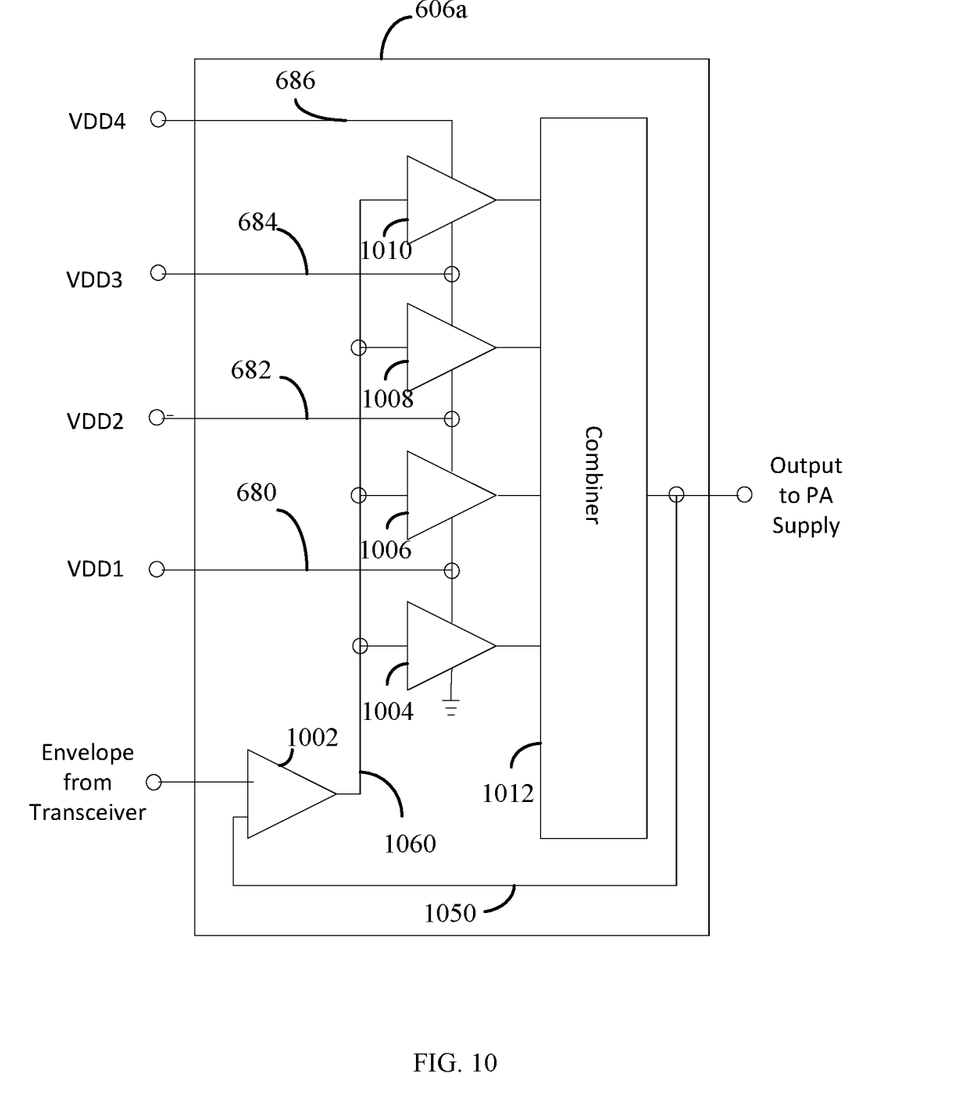
FIG. 10 is a block diagram illustrating an example implementation of a series regulator, in accordance with certain aspects of the present disclosure.

FIG. 10 is a block diagram illustrating an example implementation of a series regulator (e.g., voltage regulator 606a), in accordance with certain aspects of the present disclosure. As illustrated, the voltage regulator 606a includes an amplifier 1002 that receives an envelope signal from the transmitter 602. The amplifier 1002 may also receive a feedback signal via a feedback path 1050 representing the supply voltage of a respective PA (e.g., first PA 608a), as illustrated. The amplifier 1002 dynamically adjusts the control of amplifiers 1004, 1006, 1008, 1010 such that the feedback signal received via the feedback path 1050 matches the envelope signal from the transmitter 602.

The amplifier 1002 generates signal inputs 1060 to amplifiers 1004, 1006, 1008, 1010 based on the envelope signal from the transmitter 602 and the feedback signal via the feedback path 1050. As illustrated, the negative voltage rail of the amplifier 1004 is coupled to a reference potential node (e.g., electric ground) and the positive voltage rail of the amplifier 1004 is coupled to the output node 680 of the SMPS 604 providing the voltage output VDD1. The negative voltage rail of the amplifier 1006 is coupled to the output node 680 and the positive voltage rail of the amplifier 1006 is coupled to the output node 682 of the SMPS 604 providing the voltage output VDD2. The negative voltage rail of the amplifier 1008 is coupled to the output node 682 and the positive voltage rail of the amplifier 1008 is coupled to the output node 684 of the SMPS 604 providing the voltage output VDD3. Moreover, the negative voltage rail of the amplifier 1010 is coupled to the output node 684 and the positive voltage rail of the amplifier 1010 is coupled to the output node 686 of the SMPS 604 providing the voltage output VDD4.

The outputs of the amplifiers 1004, 1006, 1008, 1010 are provided to a combiner circuit 1012. The combiner circuit 1012 generates the supply voltage of a respective PA (e.g., first PA 608a) based on the outputs of the amplifiers 1004, 1006, 1008, 1010.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An envelope tracking modulated supply comprising:
a switched-mode power supply (SMPS);
a first voltage regulator; and
a first power amplifier having a supply input coupled to an output of the first voltage regulator, wherein the first voltage regulator is coupled in series between the first power amplifier and two or more outputs of the SMPS, the first voltage regulator being configured to generate a voltage at the output of the first voltage regulator based on an envelope of a signal to be amplified by the first power amplifier, wherein the two or more outputs of the SMPS comprise multiple supply voltage outputs, and wherein the first voltage regulator is configured to select a first one of the multiple supply voltage outputs for the generation of the voltage at the supply input of the first power amplifier.

2. The envelope tracking modulated supply of claim 1, further comprising:
a second voltage regulator; and
a second power amplifier having a supply input coupled to an output of the second voltage regulator, wherein the second voltage regulator is coupled in series between the second power amplifier and the two or more outputs of the SMPS.

3. The envelope tracking modulated supply of claim 1, wherein the first voltage regulator is configured to selectively couple the first one of the multiple supply voltage outputs based, at least in part, on the envelope of the signal to be amplified by the first power amplifier.

4. The envelope tracking modulated supply of claim 3, wherein the envelope of the signal comprises an instantaneous envelope of the signal.

5. The envelope tracking modulated supply of claim 1, wherein:
an input of the first voltage regulator is coupled to a node configured to carry the envelope of the signal to be amplified by the first power amplifier.

6. The envelope tracking modulated supply of claim 5, further comprising:
a transmitter, wherein an output of the transmitter is coupled to the node, and wherein the transmitter is configured to upconvert a baseband signal to a radio frequency (RF) signal for outputting at the output of the transmitter.

7. The envelope tracking modulated supply of claim 6, wherein:
another output of the transmitter is coupled to a signal input of the first power amplifier configured to carry the signal to be amplified.

8. A method of generating a plurality of modulated supply voltages, comprising:
generating, by a switched-mode power supply (SMPS), multiple output voltages at a plurality of outputs of the SMPS;
determining, by a transmitter, an envelope of a first radio frequency (RF) input signal to be amplified; and
selecting, by a first voltage regulator coupled to at least two of the plurality of outputs of the SMPS, a first one of the multiple output voltages based, at least in part, on the envelope of the first RF input signal.

9. The method of claim 8, further comprising:
determining, by the transmitter, an envelope of a second RF input signal to be amplified; and
selecting by a second voltage regulator, a second one of the multiple output voltages based, at least in part, on the envelope of the second RF input signal.

10. The method of claim 8, wherein selecting, by the first voltage regulator, the first one of the multiple output voltages comprises:
selectively coupling a lowest voltage output of the multiple output voltages that is greater than a voltage to be supplied from the first voltage regulator to a power amplifier, wherein the voltage to be supplied from the first voltage regulator is based on the envelope of the first RF input signal.

11. An envelope tracking modulated supply comprising:
a voltage regulator having a first input coupled to multiple voltage rails; and
a power amplifier having a supply input coupled to an output of the voltage regulator,
wherein the voltage regulator is configured to select one or more of the multiple voltage rails, based on an envelope of a signal to be amplified by the power amplifier, to provide power to the power amplifier.

12. The envelope tracking modulated supply of claim 11, wherein the voltage regulator is configured to select a single one of the multiple voltage rails based on the envelope of the signal to be amplified by the power amplifier.

13. The envelope tracking modulated supply of claim 11, wherein:
a second input of the voltage regulator is coupled to a node configured to carry the envelope of the signal to be amplified by the power amplifier.

14. The envelope tracking modulated supply of claim 11, wherein a first one of the multiple voltage rails comprises a first voltage, wherein a second one of the multiple voltage rails comprises a second voltage, and wherein the first voltage is different from the second voltage.

15. A method of generating a plurality of modulated supply voltages, comprising:
determining, by a transmitter, an envelope of a radio frequency (RF) input signal to be amplified by a power amplifier (PA); and
selecting, by a voltage regulator coupled to multiple voltage rails, one or more of the multiple voltage rails to provide power to the PA based, at least in part, on the envelope of the RF input signal.

16. The method of claim 15, wherein:
the selection of the one or more of the multiple voltage rails comprises selecting a single one of the multiple voltage rails during a first period; and
the method further comprises selecting, by the voltage regulator, two or more of the multiple voltage rails to provide power to the PA during a second period that is different than the first period.

17. The method of claim 16, wherein the selecting the two or more of the multiple voltage rails is based, at least in part, on the envelope of the RF input signal.

18. The method of claim 16, wherein the voltage regulator is configured to dynamically switch between the selecting of the two or more of the multiple voltage rails and the selecting of the single one of the multiple voltage rails based on changes in the envelope of the RF input signal with time.

* * * * *